United States Patent [19]
Rader et al.

[11] Patent Number: 6,110,844
[45] Date of Patent: Aug. 29, 2000

[54] REDUCTION OF PARTICLE DEPOSITION ON SUBSTRATES USING TEMPERATURE GRADIENT CONTROL

[75] Inventors: Daniel J. Rader; Ronald C. Dykhuizen; Anthony S. Geller, all of Albuquerque, N. Mex.

[73] Assignee: Sandia Corporation, Albuquerque, N. Mex.

[21] Appl. No.: 08/537,192

[22] Filed: Sep. 29, 1995

[51] Int. Cl.[7] .................. H01L 21/302; H01L 21/465
[52] U.S. Cl. .................. 438/795; 438/909; 438/935; 437/225; 437/228
[58] Field of Search .................. 437/225, 228; 438/795, 909, 935

[56] References Cited

U.S. PATENT DOCUMENTS

| | | | |
|---|---|---|---|
| 5,061,444 | 10/1991 | Nazaroff et al. | 422/40 |
| 5,158,690 | 10/1992 | Batchelder et al. | 210/775 |
| 5,356,476 | 10/1994 | Foster et al. | 118/725 |
| 5,373,806 | 12/1994 | Logar | 117/106 |

*Primary Examiner*—Gary Geist
*Assistant Examiner*—Brian J. Davis
*Attorney, Agent, or Firm*—Brian W. Dodson

[57] ABSTRACT

A method of reducing particle deposition during the fabrication of microelectronic circuitry is presented. Reduction of particle deposition is accomplished by controlling the relative temperatures of various parts of the deposition system so that a large temperature gradient near the surface on which fabrication is taking place exists. This temperature gradient acts to repel particles from that surface, thereby producing cleaner surfaces, and thus obtaining higher yields from a given microelectronic fabrication process.

28 Claims, 6 Drawing Sheets

REDUCTION OF PARTICLE DEPOSITION ON SUBSTRATES USING TEMPERATURE GRADIENT CONTROL

This invention was made with Government support under Contract DE-AC04-94AL85000 awarded by the U.S. Department of Energy. The Government has certain rights in the invention.

BACKGROUND OF THE INVENTION

This invention relates to a method for reducing the number of defects in a film structure resulting from deposition of minute particles on the substrate before, during, or after a fabrication process. Such defects are of particular importance for the production of integrated circuits having both small feature size and large numbers of components. One example of such integrated circuits is very high capacity (>1 Mbyte) memory chips. Even though some redundancy can be designed into such a circuit, the probability that a small number of minute defects will inactivate the circuit is high. The present invention seeks to address such process limitations.

In semiconductor manufacturing, many process steps take place at pressures well below atmospheric pressure. As a result, the pressure surrounding the semiconductor substrates (wafers) being processed must be reduced to at least the working pressure of the process steps in preparation for processing. During processing, a combination of, e.g., chemical vapor and physical deposition and etching processes may require the pressure of the processing environment to repeatedly cycle between a fraction of atmospheric pressure and nearly zero pressure. Following processing, the wafers are returned to atmospheric pressure so they can be removed from the film growth/etching processing chamber and prepared for further processing steps.

Considerable evidence exists suggesting that altering the pressure surrounding the wafers in the course of fabrication results in deposition of microscopic particles on the wafers. The most likely mechanism for this effect has to do with differential changes of wafer, gas, and chamber temperatures which occur during changes of gas pressure.

A wafer suspended in a chamber (usually mounted on a paddle with pins or in a boat via an edge contact) is typically not in good thermal contact with the surrounding chamber walls. (Reference to a chamber or a fabrication chamber is intended also to refer to any vessel utilized in fabrication processes taking place at sub-atmospheric pressures, e.g., a loadlock.) As the surrounding gas is pumped away, the temperature of the gas remaining in the chamber decreases. Both the wafer and the chamber walls lose heat to the gas, and are thereby cooled. As the wafer is nearly isolated from any source of heat but the gas, and has very small thermal mass, the temperature of the wafer decreases considerably more than does the chamber in response to the cooling of the circumambient atmosphere. When pumping is finished, contact with the chamber serves to heat the remaining gas to the desired process temperature. As the gas temperature rises above the wafer temperature, the wafer will begin to heat slowly, leaving the wafer temperature significantly below both the gas and chamber temperatures for a period of time. During the inverse process (increasing pressure), compressive heating of the gas also results in a period of time when the wafer temperature is less than the gas temperature.

Considerations based on molecular transport physics suggest that there is an overall tendency for particles and other contaminants suspended in a medium having a thermal gradient to be driven preferentially toward cooler temperatures. (This effect is called thermophoresis.) When the wafer is colder than the surrounding gas (for the purposes of this application, the term "surrounding gas" refers to the gas which contributes to the thermophoretic force at the surface of the wafer), the resulting temperature gradient in the gas surrounding the wafer produces thermophoretic forces which drive the process of particle deposition on the wafer. Pressure changes which occur in the normal course of fabrication can drive heating or cooling of the gas in a chamber, thereby creating such temperature gradients.

The velocity of particles driven by thermophoresis in the low pressure (sub-atsmospheric) regime is proportional to the temperature gradient and the gas viscosity, and inversely proportional to the square root of the gas molecular weight. Reduction of particle deposition on wafers during fabrication processes can thus be effected by taking measures to insure that the wafer temperature remains above the temperature of the surrounding gas, especially during pressure changes. Such techniques can be supplemented by other measures, such as cooling the chamber walls to a temperature below that of the wafer so as to cool the gas filling the chamber and to preferentially trap particles on the chamber walls, controlling the dynamics of any change in gas pressure to minimize the differential temperature between the wafer and the surrounding gas, and, on venting the chamber, precooling the incoming gas to offset pressurization-related heating of the gas in the chamber. However, the essence of the technique is to maintain the wafer at a higher temperature than the surrounding gas during changes in gas pressure.

The nearest prior art is probably in U.S. Pat. No. 5,373, 806 (Logar). Logar describes a method to reduce or eliminate particles and particle-generated defects in gas-phase processing. His emphasis is on removing the effects of electrostatic attraction between particles and a surface through the use of IR radiation, thermal heating, or inductive heating to above about 180° C., but below the intended process temperature. Logar also states that the primary effectiveness of his method occurs during purging the chamber with cold gas.

The present method requires controlling process parameters so that the gas surrounding the wafer will never be at a higher temperature than the wafer surface.

In the case of initial evacuation from ambient atmospheric conditions (nominally STP (standard temperature and pressure)), the wafer temperature required to implement the present invention is only perhaps 30° C., a value far short of the 180° C. taught by Logar. In the case of venting the chamber, however, heating of the wafer to a temperature 10–20° C. higher than the process temperature will typically be required to carry out the present method, whereas temperatures above the process temperature are specifically ruled out by Logar. Accordingly, the present method and that of Logar are clearly disjoint, although they may be carried out by rather similar apparatus.

An object of the present invention is to provide a method for reduction of particle deposition on wafers during fabrication processes involving changes in gas pressure within the fabrication chamber.

Another object of the present invention is to detail apparatus which enables the above method and is easy to retrofit to existing fabrication chambers (including access loadlocks as are well known in the art).

A further object of the present invention is to minimize deposition of particles on selected surfaces within a chamber undergoing changes in pressure.

These and other objects of the present invention will be made clear in the following discussion.

SUMMARY OF THE INVENTION

The prior art techniques used to reduce particle deposition are supplemented significantly by the present invention. Changes in chamber pressure can lead to temperature gradients which generate thermophoretic forces on particles suspended in the chamber gas. This invention seeks to control such forces by controlling the temperature gradients within said chamber, especially during changes in chamber pressure, so that the thermophoretic forces act to repel said particles from the surface of the part being fabricated. Such forces will act to repel particles before the interaction of static charges (usually generated by atmospheric friction which accompanies rapid changes in chamber pressure) with conducting or dielectric surfaces produce significant forces. In addition, the present invention can be used in many commercial deposition chambers with a minimum of additional equipment which is easily retrofittable. Several implementations of the current invention are discussed in this specification. This is not intended to limit the present invention to these implementations. The present invention is only intended to be limited by the appended claims.

DETAILED DESCRIPTION OF THE INVENTION

Figure 1:
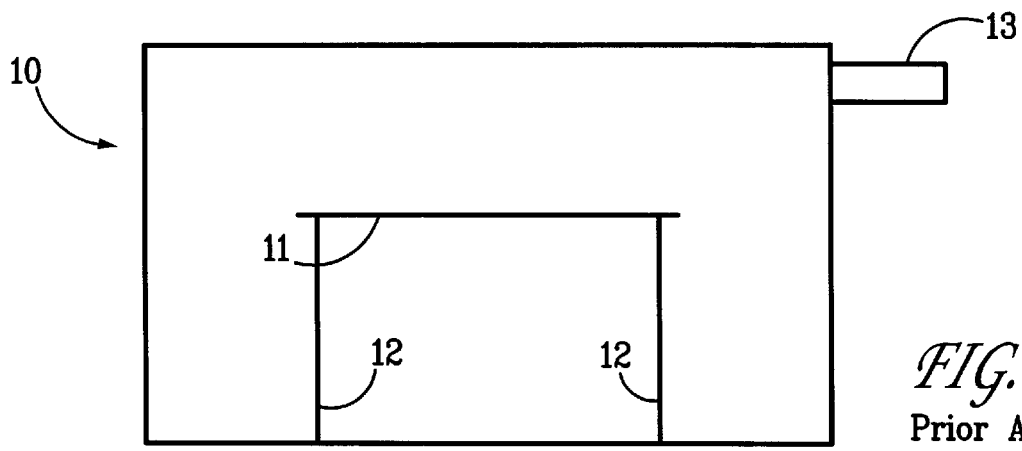
FIG. 1 is a schematic illustration of the conventional fabrication chamber design.

In FIG. 1 appears a schematic of a prior art fabrication chamber. The chamber 10 surrounds a wafer 11. (Wafer 11 can represent multiple wafers mounted within chamber 10.) Wafer 11 is suspended within chamber 10 by a mounting device 12 which is reasonably stable, but which may or may not provide significant thermal contact between wafer 11 and chamber 10. Vent 13 allows gases to be pumped from within chamber 10, or to be introduced into chamber 10, at will. (A gas handling and pumping apparatus connects to vent 13. As it is conventional in nature, it has not been included in the figures.)

In one mode of operation, wafer 11 is mounted within chamber 10. An inert fill gas may first be introduced into the chamber. The pressure of the gas inside the chamber is then reduced to operating pressure (e.g., 50–100 Torr for chemical vapor deposition, 10–100 m Torr for etching, and ~$10^{-6}$ Torr or less for physical deposition techniques, ion implantation, and the like). The chamber is then purged with the proper source gases required to enable the desired fabrication process. Other process paths include purging the initial gas with the proper source gases at atmospheric pressure, followed by reducing the pressure of the source gases; reducing the pressure of the gas inside the chamber to base pressure (the lowest pressure which can be achieved by the pumping system), followed by backfilling with the proper source gases; and displacing the initial atmosphere with an inert fill gas, reducing the pressure within the chamber, and introducing the proper source gases. In many conventional fabrication processes, the pumpdown will take place in a loadlock, followed by transfer of the wafer into the primary reaction chamber, whose pressure (usually that of an inert fill gas) is already at the desired process value. These and other process paths and conditions obvious to one skilled in the art are intended to be included in the present invention.

The common feature of the above preparatory process steps is that the chamber pressure is reduced at some point. As is well known, reduction of pressure is accompanied by a cooling of the gas remaining in the chamber. As the primary thermal contact of wafer 11 is with the gas filling chamber 10, and wafer 11 has large surface area and small thermal mass, the temperature of wafer 11 will decrease while the temperature of the gas surrounding wafer 11 is less than the temperature of wafer 11. The temperature of chamber 10 will also decrease while the temperature of the gas contained within chamber 10 is less than the temperature of chamber 10, but because of its large thermal mass, said chamber will cool to a lesser extent than wafer 11.

Figure 2:
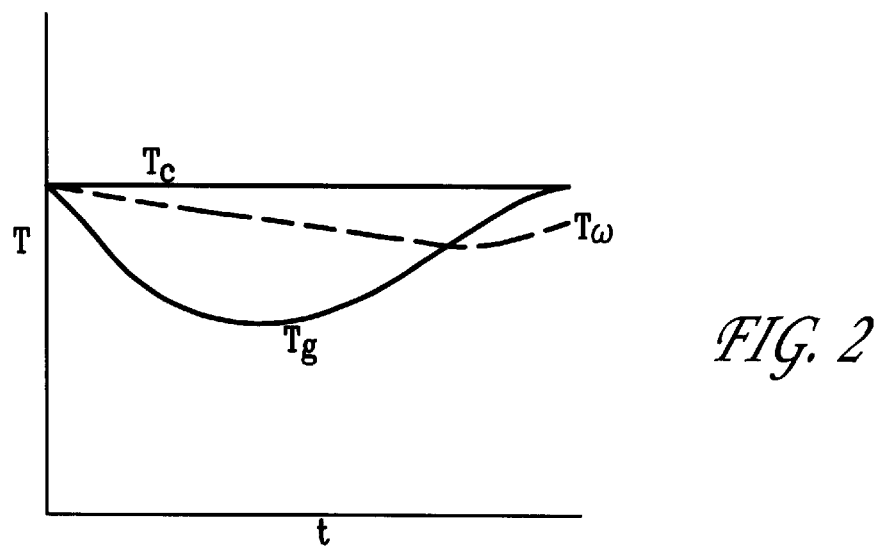
FIG. 2 is a schematic graph of the effects of the thermal dynamics of the above system on reduction of chamber gas pressure.

The time-dependence of the gas, wafer, and chamber temperatures on reducing the gas pressure within chamber 10 is illustrated in FIG. 2. Initially the gas temperature $T_g$ falls as pumping proceeds, but eventually rises again through absorption of heat from chamber 10. However, once the chamber gas reequilibrates with the chamber, the system enters a regime where $T_g > T_w$. In this regime thermophoresis acts to propel particles onto the surface of wafer 11, on which they generally adhere strongly. As a result, reduction of pressure in such a system can lead to adverse temperature gradients, and thus particle deposition.

Figure 3:
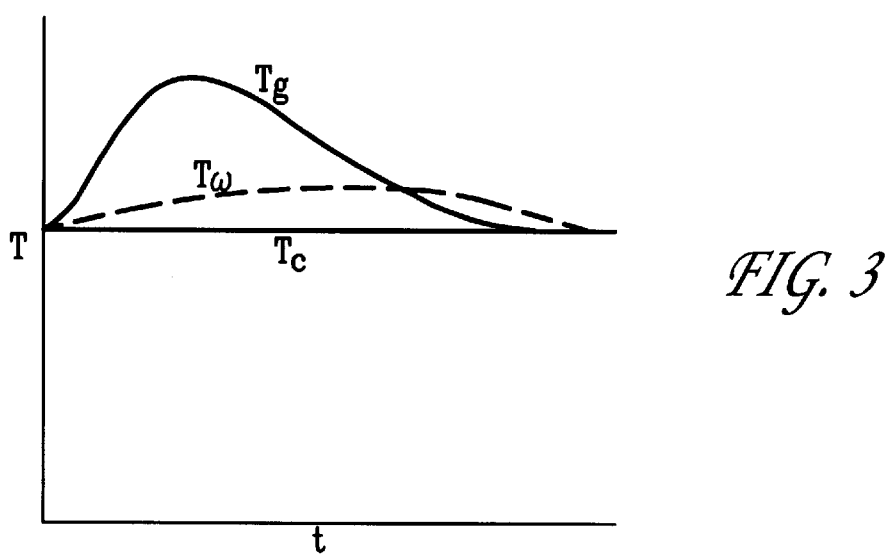
FIG. 3 is a schematic graph of the effects of the thermal dynamics of the above system on increase of chamber gas pressure.

A similar effect occurs when the pressure is increased, as illustrated in FIG. 3. In this case $T_g$ initially increases through compression as the chamber is backfilled. The increase of $T_g$ acts to transfer heat to the wafer, thereby increasing $T_w$, but the thermal mass of the wafer greatly reduces the rate of increase of $T_w$ relative to that of $T_g$. As a result, through most of the backfill cycle $T_g > T_w$. Again, in this regime thermophoresis acts to propel particles toward the wafer surface, resulting in particle deposition. Note that this effect will be seen even when physical deposition techniques are used, where said techniques function at extremely low pressures (generally <$10^{-6}$ Torr).

Figure 4:
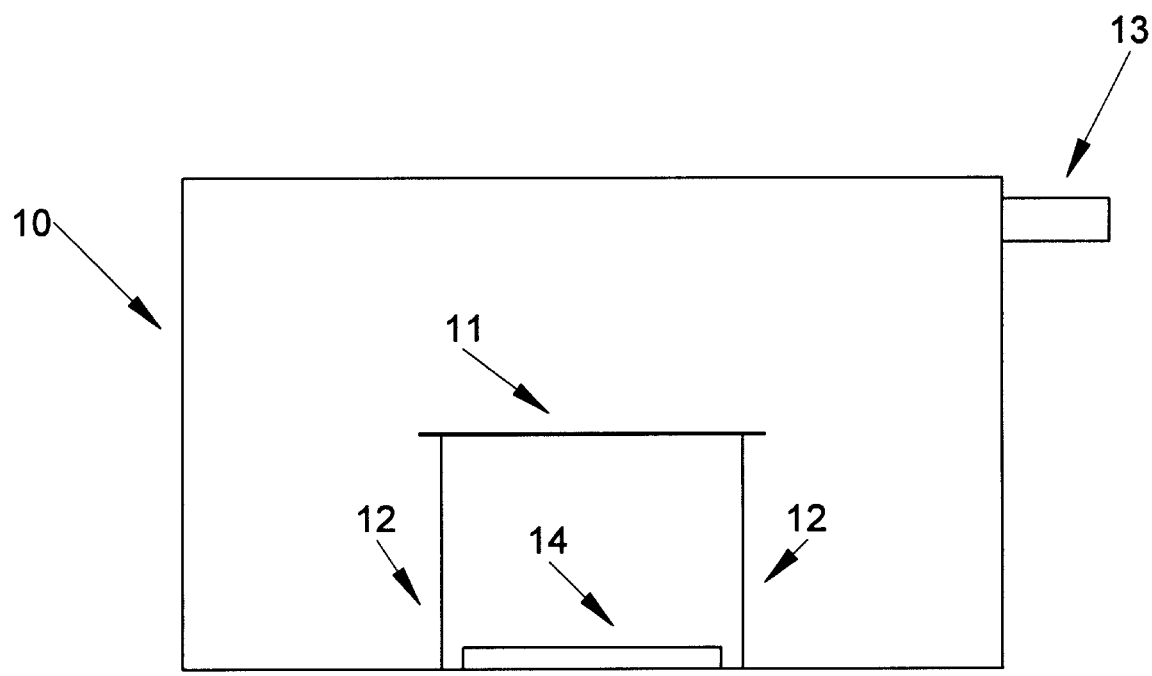
FIG. 4 is a schematic illustration of one implementation of a fabrication chamber design which allows the present invention to function.

We have illustrated above how fabrication processes using prior art fabrication techniques must include a regime where particles are driven by thermophoresis toward the surface of the wafer being processed. The essence of the present invention is now illustrated in FIG. 4. This is the same schematic illustration of a fabrication chamber as appeared in FIG. 1, except that a radiative heat source 14 which acts through a cooled topplate has been added. Radiative heat source 14 preferentially heats wafer 11, so that the wafer temperature is maintained above the temperature of the surrounding gas. Other approaches to heating the wafer include providing a source of inductive heat, or supplying a source of radiative, convective, or conductive heat to the back side of the wafer.

The addition of heat source 14 allows the thermal dynamics associated with both reduction and increase of chamber pressure to be altered. In particular, one may choose operation parameters so that thermophoresis always acts to repel particles from the wafer surface.

Figure 5:
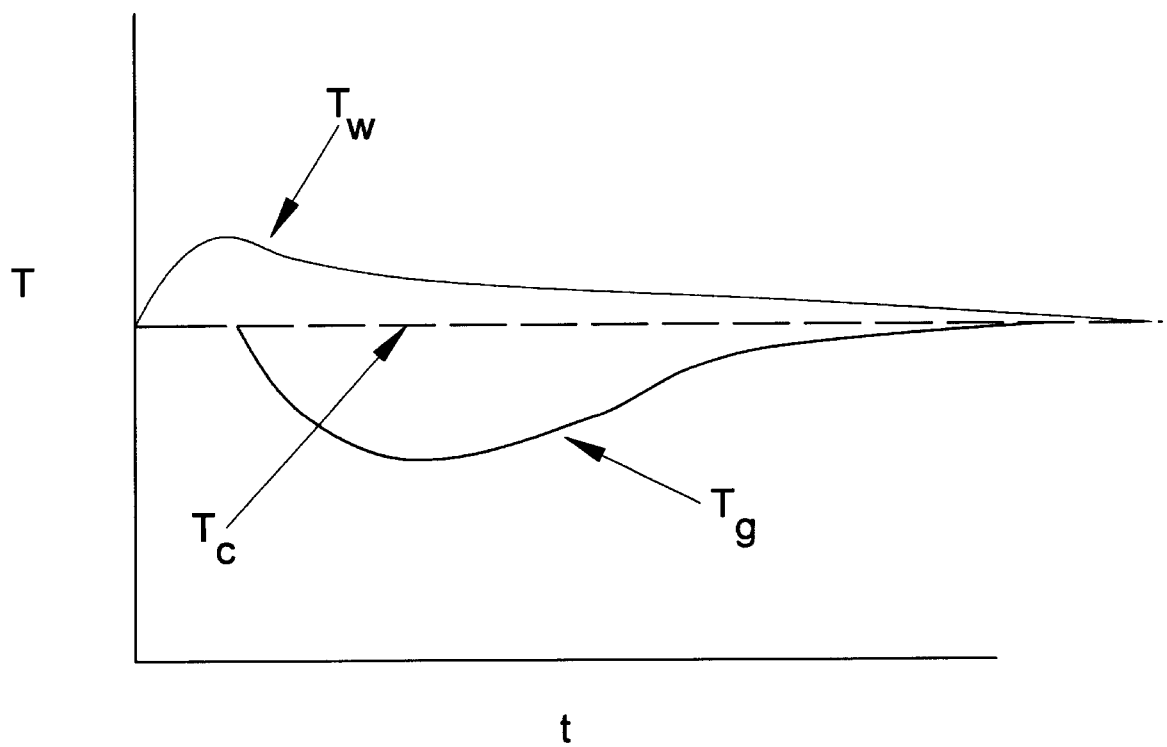
FIG. 5 is a schematic graph of the effects of the thermal dynamics of the system of FIG. 4 on reduction of chamber gas pressure following heating of the wafer.
Figure 6:
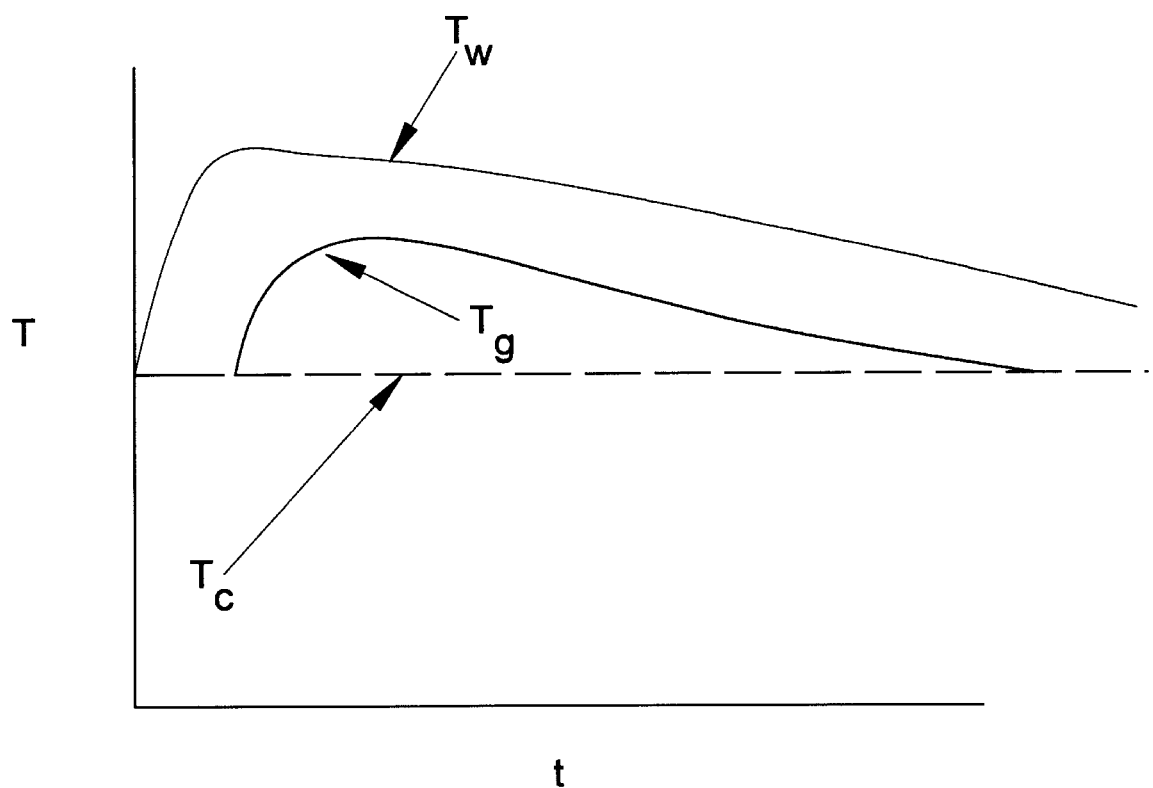
FIG. 6 is a schematic graph of the effects of the thermal dynamics of the system of FIG. 4 on increase of chamber gas pressure following heating of the wafer.

Such operation parameters are illustrated in FIGS. 5 and 6 (reduction and increase of chamber pressure, respectively). FIG. 5 shows the thermal dynamics of a system undergoing reduction of pressure when said reduction is preceded by heating wafer 11 above the chamber gas temperature. $T_g$ initially decreases as a result of reducing the chamber gas pressure, followed by a gradual increase of temperature to the chamber temperature through thermal contact with the chamber walls. The wafer temperature $T_w$ falls through contact with the cooled chamber gas. However, the initial heating of the wafer by heat source 14 is sufficient that $T_g < T_w$ for all time. As a result, thermophoresis always acts to repel particles from the wafer surface, thereby significantly reducing the ultimate particle density on the wafer surface.

The analogous thermal dynamics associated with an increase in chamber gas pressure appears in FIG. 6. In this case, wafer 11 is preheated by heat source 14 to a temperature greater than the expected maximum gas temperature. Thus $T^g$ is always less than $T_w$, and again thermophoresis drives particles away from the surface of wafer 11, reducing the extent of particle deposition.

The extent to which the wafer temperature must be increased prior to a given change in chamber gas pressure depends on the rate of pressure change, the detailed geometry of the system, the gases which fill the chamber, the amount of thermophoretic repulsion desired, and many other factors. In a given process situation, however, the required increase in wafer temperature can be found by applying conventional simulation techniques or through a short series of experiments.

Note that the full increase of wafer temperature need not occur prior to a change in chamber gas pressure. Rather, heat source 14 may be used during the change in chamber gas pressure to maintain the operating condition $T_g < T_w$. An increase in wafer temperature in an active CVD gas mixture will generally result in a sudden spurt of growth, possibly associated with poor quality growth and defective circuits. Providing heat to wafer 11 during the change of chamber gas pressure will minimize the initial increase in wafer temperature required to maintain the desired operating conditions, thereby also minimizing any undesired growth associated with heating of the wafer.

Wafer 11 may be heated prior to insertion into chamber 10 to provide thermophoretic protection against particle deposition on said wafer during the initial reduction of chamber gas pressure. However, this procedure is less flexible, as the thermal time constant of the wafers is finite, and such heating cannot be repeated during the course of the fabrication process.

An examination of the thermal dynamics of the system reveals that, for most practical processes involving an unheated wafer, the largest thermophoretic impulse driving particles to the surface of the wafer occurs on pressurization of the chamber. This effect can be mostly or entirely ameliorated by precooling the gas which is being used to pressurize the chamber.

Figure 7:
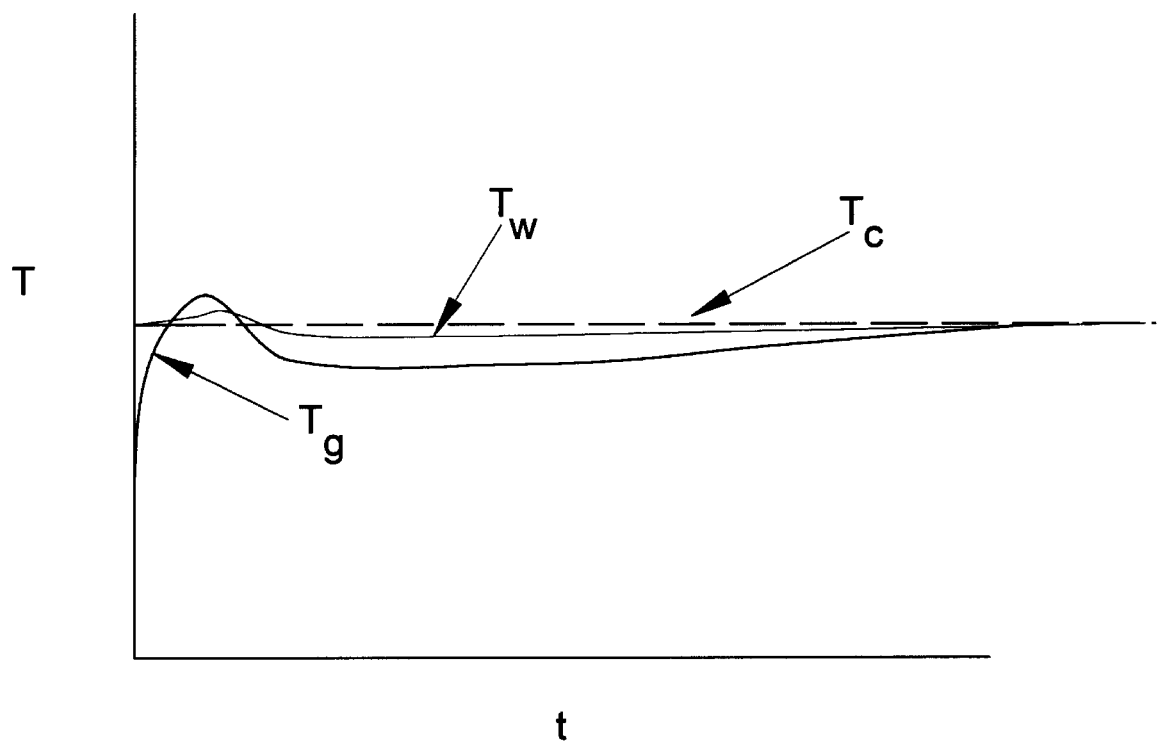
FIG. 7 is a schematic graph of the effects of the thermal dynamics of the system of FIG. 4 on increase of chamber gas pressure when the fill gas is cooled.

The resulting thermal dynamics is illustrated in FIG. 7. The increase in chamber gas temperature resulting from compression of the gas within the chamber is offset by pressurizing said chamber from a source of gas having temperature less than the chamber temperature. There may be an initial peak in the chamber gas temperature (as shown), so that $T_g < T_w$ for the majority of the pressurization cycle, or the temperature of the incoming gas may be low enough to maintain $T_g < T_w$ for the entire pressurization cycle. Another possibility is to combine pressurization with cooled gas with a small amount of wafer heating. In any case, the result is to maintain process conditions under which thermophoretic forces repel particles from the surface of the wafer for most or all of a given pressurization cycle. As this method can be implemented with no changes to the chamber, it can easily be used in conventional chambers, requiring only minor changes in the gas handling system.

A potential difficulty in implementation of the above procedure is associated with the non-equilibrium nature of the gas heating and cooling process. Mixing of the incoming cool gas with the compressed (and thus heated) chamber gas will not be perfect. As a result, it is not always clear what locations in the chamber will be effectively cooled by the incoming cooled gas. As the object is to control the gas temperature in the immediate vicinity of the wafer surface, this uncertainty may make simple input of cooled gas through a venting system of arbitrary geometry ineffective in reducing particle deposition on the wafer surface.

Figure 8:
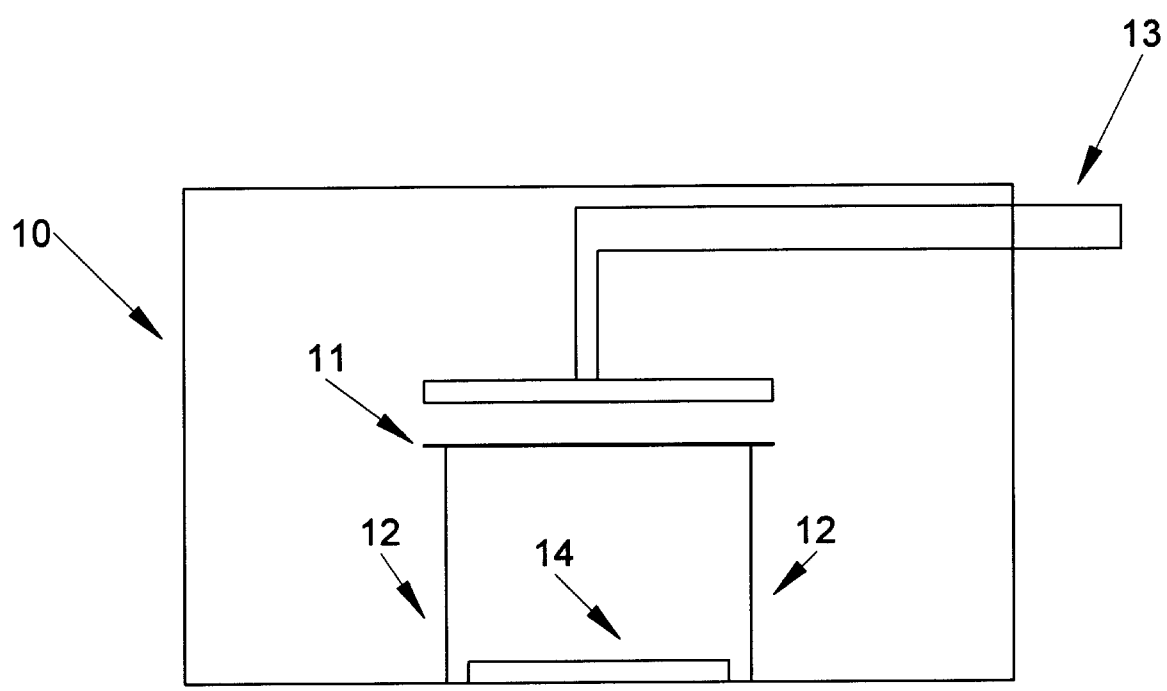
FIG. 8 is a schematic illustration of a fabrication chamber in which on venting, incoming gas is cooled and distributed so that the cool gas sweeps the warmer compressed gas away from the wafer.

This problem can be addressed without detailed three-dimensional simulation of the gas dynamics of the vent system and the chamber. As shown in FIG. 8, a special vent can be positioned relative to the wafer surface so that on pressurization, the incoming cooled gas sweeps the surface of the wafer, thereby removing hot compressed gas from the neighborhood of the wafer. The desired state of cooled gas surrounding the warmer wafer is thus maintained. Suitable shapes for the special vent include a tube, a showerhead, a showerhead having tilted nozzles, and many others known in the art. Additional improvement to this approach is provided by including the ability to pump heated gas from the chamber while cooled gas is introduced. This acts to further reduce the average temperature of the chamber gas, and, given that the pumping rate is less than the venting rate, still allows the chamber pressure to increase.

Additional process conditions exist which can, under certain circumstances, assist the overall goal of reducing particle deposition. One example is to maintain the walls of the chamber at a temperature less than the wafer. The resulting temperature gradient within the chamber is similar to that resulting from heating the wafer. Cooling the chamber walls therefore produces a thermophoretic force which drives particles toward the chamber walls and away from the wafer, thereby reducing the probability that they will deposit on the wafer.

In all cases where maintenance of a given temperature relationship between the wafer and the chamber gas during a change in chamber gas pressure is required, controlling the rate of change of chamber gas pressure will affect the change of chamber gas temperature. Other approaches toward controlling the thermal gradients within the fabrication chamber include i) decreasing the distance between the wafer surface and the chamber wall, and/or ii) increasing the thermal conductivity of the chamber gas. These effects are maximized by use of a high viscosity or low molecular weight gas (e.g., $H_2$ or He). The above approaches reduce the thermal excursions of the wafer temperature in response to the change in temperature of the surrounding gas. Such effects can be used to help maintain the desired process conditions.

Numerous implementations of the present invention have been discussed above. However, it is not intended that the scope of the present invention be limited by the implementations presented, but only by the scope of the appended claims.

We claim:

1. A method for reducing deposition of particles upon a substrate undergoing a fabrication process, said substrate comprising a front surface, an edge, and a back surface, inserting said substrate into a chamber containing an atmosphere undergoing changes in ambient pressure, further comprising maintaining said front surface at a temperature exceeding the temperature of the atmosphere adjacent to the surface.

2. The method of claim 1, wherein said atmosphere has a low molecular weight.

3. The method of claim 2, wherein said atmosphere consists of $H_2$ or He.

4. The method of claim 1, further comprising raising the temperature of said front surface above that of the atmosphere adjacent to the front surface through absorbing thermal radiation from a source of thermal radiation onto a surface of said substrate.

5. The method of claim 1, further comprising raising the temperature of said front surface above that of the atmosphere adjacent to the front surface by inductive heating.

6. The method of claim 1, further comprising raising the temperature of said front surface above that of the atmosphere adjacent to the front surface by convective heating of the back surface.

7. The method of claim 1, further comprising raising the temperature of said front surface above that of the atmosphere adjacent to the front surface by conductive thermal contact with a heat source.

8. The method of claim 1 applied to situations of increasing ambient pressure, further comprising compensating the dynamic heating of the atmosphere by introducing cooled gas into the chamber, thereby maintaining the temperature of the atmosphere at a lower value than that of said front surface.

9. The method of claim 8, further comprising introducing the cooled gas into the chamber in such a manner that said cooled gas sweeps the dynamically heated gas away from the front surface.

10. The method of claim 1 as applied to situations of increasing ambient pressure, further comprising pumping the compressively heated atmosphere from said chamber concurrently with said increase of ambient pressure.

11. The method of claim 8, wherein said cooled gas has a low molecular weight.

12. The method of claim 11, wherein said cooled gas consists of $H_2$ or He.

13. The method of claim 1, further comprising cooling the chamber walls below the temperature of the substrate.

14. The method of claim 13, further comprising mounting said substrate within said chamber as to minimize, as far as is consistent with proper operation of the fabrication process, the distance between the front surface of the wafer and said chamber.

15. The method of claim 13, wherein said atmosphere comprises a low molecular weight gas.

16. The method of claim 15, wherein said low molecular weight gas consists of $H_2$ or He.

17. The method of claim 1, further comprising heating said substrate immediately prior to insertion into said chamber.

18. The method of claim 1, further comprising reducing the tendency of said front surface to cool below the temperature of the chamber by maximizing the thermal conductance of the atmosphere.

19. The method of claim 18, wherein maximizing the thermal conductance between said surface and the chamber is accomplished by purging of the atmosphere extant prior to the pressure change with a gas having high thermal conductivity.

20. The method of claim 19, wherein said gas is either $H_2$ or He.

21. An apparatus for fabricating structures on a fabrication surface with automatic control of deposition conditions to minimize particle deposition, comprising:
   a) a fabrication chamber comprising walls;
   b) a substrate comprising a fabrication surface, located within said fabrication chamber;
   c) a process gas which fills said fabrication chamber;
   d) sensors to measure the temperature of the fabrication surface, and the temperature of the process gas; and,
   e) a process control system comprising:
      i) a computer comprising a CPU, memory, I/O control means, and a control program resident in said memory, wherein said control program directs the operation of the apparatus so as to minimize particle deposition;
      ii) gas control means to extract or introduce gases into the fabrication chamber, controlled by the computer I/O control means; and,
      iii) a substrate heater functionally connected to the substrate and controlled by the computer I/O control means.

22. The apparatus of claim 21, wherein the control program comprises software which carries out the following functions:
   a) prior to instructing the gas control means to carry out a process step which will change the pressure, temperature, or composition of the process gas, measure the temperature T of the fabrication surface and the temperature $\tau$ of the process gas;
   b) if T-$\tau$ is large enough that thermophoretic protection of the fabrication surface will be maintained during said process step, proceed with said process step; and,
   c) if T-$\tau$ is not large enough that thermophoretic protection of the fabrication surface will be maintained during said process step, increase the output of the substrate heater until T-$\tau$ is large enough, then proceed with the change.

23. The apparatus of claim 22, further comprising conditioning means to control the temperature of the fabrication chamber walls, said conditioning means being controlled by the computer I/O control means.

24. The apparatus of claim 23, wherein the control program further comprises software which carries out the following functions:
   a) periodically measure the temperature $\psi$ of the fabrication chamber walls and the temperature T of the fabrication surface; and,
   b) maintain T-$\psi$ at or above a predetermined process value by means comprising using the computer I/O control means to instruct the conditioning means to reduce the temperature of the fabrication chamber walls.

25. The apparatus of claim 22, further comprising sweep gas means, controlled by the computer I/O control means, which use gas with temperature less than that of the fabrication surface to sweep compression-heated chamber gas from the fabrication surface.

26. The apparatus of claim 25, wherein the control program further comprises software which carries out the functions:

a) prior to instructing the gas control means to change the pressure, temperature, or composition of the process gas, use the CPU and a program stored in memory to estimate the upcoming change in chamber gas temperature; and, b) if the upcoming change in chamber gas temperature is large enough to threaten continued thermophoretic protection of the fabrication surface, use the computer I/O control means to activate the sweep gas means.

27. The apparatus of claim 22, further comprising conditioning means to control the temperature of the fabrication chamber walls, said conditioning means being controlled by the computer I/O control means, and sweep gas means, controlled by the computer I/O control means, which use gas with temperature less than that of the fabrication surface to sweep compression-heated chamber gas from the fabrication surface.

28. The apparatus of claim 22, wherein the control program further comprises software which carries out the functions:

a) periodically measure the temperature $\psi$ of the fabrication chamber walls and the temperature $T$ of the fabrication surface;

b) maintain $T-\psi$ at or above a predetermined process value by means comprising using the computer I/O control means to instruct the conditioning means to reduce the temperature of the fabrication chamber walls;

c) prior to instructing the gas control means to change the pressure, temperature, or composition of the process gas, use the CPU and data stored in memory to determine the upcoming change in chamber gas temperature; and, d) if the upcoming change in chamber gas temperature is large enough to threaten continued thermophoretic protection of the fabrication surface, use the computer I/O control means to activate the sweep gas means.

* * * * *